United States Patent
Heukensfeldt Jansen et al.

(10) Patent No.: US 9,739,860 B2
(45) Date of Patent: Aug. 22, 2017

(54) SYSTEMS AND METHODS FOR LANDMARKING FOR SUBJECT IMAGING

(71) Applicant: General Electric Company, Schenectady, NY (US)

(72) Inventors: Floribertus Philippus Martinus Heukensfeldt Jansen, Ballston Lake, NY (US); Robert David Darrow, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 1153 days.

(21) Appl. No.: 13/730,405

(22) Filed: Dec. 28, 2012

(65) Prior Publication Data

US 2014/0184218 A1 Jul. 3, 2014

(51) Int. Cl.
*G01R 33/54* (2006.01)

(52) U.S. Cl.
CPC ......... *G01R 33/543* (2013.01); *G01R 33/546* (2013.01)

(58) Field of Classification Search
CPC ..................... G01R 33/543; G01R 33/546
See application file for complete search history.

(56) References Cited

U.S. PATENT DOCUMENTS

| | | | |
|---|---|---|---|
| 6,236,205 B1 * | 5/2001 | Ludeke | A61B 5/06 324/300 |
| 7,612,562 B2 | 11/2009 | Yasuhara | |
| 7,800,368 B2 * | 9/2010 | Vaughan | G01R 33/583 324/318 |
| 7,822,460 B2 * | 10/2010 | Halperin | A61B 5/055 324/307 |
| 8,008,917 B2 | 8/2011 | Satragno et al. | |
| 8,014,575 B2 | 9/2011 | Weiss et al. | |
| 8,023,706 B2 | 9/2011 | Witte | |
| 8,583,213 B2 * | 11/2013 | Dumoulin | A61B 5/055 600/410 |
| 8,885,904 B2 | 11/2014 | Darrow et al. | |
| 2002/0145563 A1 | 10/2002 | Kane et al. | |
| 2004/0034297 A1 | 2/2004 | Darrow et al. | |
| 2007/0219443 A1 | 9/2007 | Ehnholm et al. | |
| 2008/0001600 A1 | 1/2008 | Decharms | |
| 2008/0297153 A1 | 12/2008 | Nozaki | |
| 2009/0234218 A1 | 9/2009 | Washburn et al. | |

(Continued)

FOREIGN PATENT DOCUMENTS

| CN | 1668254 A | 9/2005 |
|---|---|---|
| CN | 101035462 A | 9/2007 |
| JP | 2011216451 A | 9/2011 |

OTHER PUBLICATIONS

"DiscoveryTM MR450", GE Healthcare, pp. 1-20; 2008.

(Continued)

*Primary Examiner* — Dixomara Vargas
(74) *Attorney, Agent, or Firm* — Pabitra K. Chakrabarti

(57) ABSTRACT

An imaging system includes an imager adapted to obtain an image of a desired region of interest of a subject and a coil positioned on the desired region of interest of the subject. The coil includes a plurality of markings disposed at a plurality of locations on the coil. The imaging system also includes a position indication device having a user interface adapted to receive input from a user indicating which of the plurality of markings corresponds to a desired scan plane of the subject.

12 Claims, 5 Drawing Sheets

(56) References Cited

U.S. PATENT DOCUMENTS

| | | |
|---|---|---|
| 2011/0210734 A1 | 9/2011 | Darrow et al. |
| 2011/0228998 A1 | 9/2011 | Vaidya et al. |
| 2012/0161767 A1 | 6/2012 | Hardy et al. |
| 2013/0136329 A1 | 5/2013 | Tao et al. |
| 2013/0165767 A1 | 6/2013 | Darrow et al. |
| 2014/0155736 A1 | 6/2014 | Vaidya et al. |

OTHER PUBLICATIONS

Rothgang, Eva, et al.; "Improved Workflow for Freehand MR-Guided Percutaneous Neddle Interventions: Methods and Validation", Proceedings of International Society for Magnetic Resonance in Medicine, 20, pp. 1605; May 2012.

Chinese Office Action issued in connection with corresponding CN Application No. 201310741519.0, dated Apr. 6, 2017.

\* cited by examiner

SYSTEMS AND METHODS FOR LANDMARKING FOR SUBJECT IMAGING

BACKGROUND

The subject matter disclosed herein generally relates to imaging systems and, more particularly, to systems and methods for landmarking during imaging operations.

Diagnostic imaging procedures entail specific scan configurations that enable acquisition and reconstruction of imaging data from a desired region of interest (ROI) of a subject, such as a patient, to aid in accurate medical diagnoses. Magnetic Resonance (MR) imaging, for example, includes a plurality of scan configurations that specify parameters related to a patient position, positioning radiofrequency (RF) coils and landmarking a ROI of the patient for specific imaging protocols. In particular, landmarking registers a patient with a scanner coordinate system to enable an imaging volume to be moved to a homogeneous imaging portion, for example, an iso-center of a magnet, for desired imaging.

Accurate positioning of the anatomy of interest in the center of the magnet, characterized by the best field homogeneity, is significant in allowing for optimal imaging. For example, a landmarking error may result in images of low diagnostic quality and inadequate coverage of anatomy, thus making the images unsuitable, for example, for specific exams and/or automatic scan plane prescription algorithms. Particularly, inadequate coverage of the desired ROI may necessitate additional data acquisition in the direction of the superior/inferior (S/I) axis of the MR coil, thus further increasing the exam duration and adding to patient discomfort.

In many current landmarking processes, a system operator defines the center of an imaging region through mechanical, optical, or other suitable means. For example, the system operator may position the patient on an examination table, position a MR coil on a desired ROI of the patient, and position the table within the magnet bore such that the desired ROI coincides with scanner alignment lights. Unfortunately, current landmarking processes are associated with a variety of drawbacks that may lead to reduced efficiency and increased monetary cost. For example, current procedures for setting up the scan plane may be cumbersome for the operator, thus increasing the amount of time necessary to set up the imager. Further, many current procedures require hardware that can increase the monetary cost of the imaging system. Accordingly, there exists a need for landmarking systems and methods that address these drawbacks.

BRIEF DESCRIPTION

In one embodiment, a method for landmarking in an imaging system includes inducing a non-saturating signal in a receive coil array, wherein the receive coil array is placed over a desired region of interest of a subject. The method also includes determining a phase difference between one or more sets of corresponding coils in the receive coil array and determining, based on the determined phase difference between the one or more sets of corresponding coils in the receive coil array, a location of the receive coil array with respect to a gantry of the imaging system.

In another embodiment, an imaging system includes an imager adapted to obtain an image of a desired region of interest of a subject and a coil positioned on the desired region of interest of the subject. The coil includes a plurality of markings disposed at a plurality of locations on the coil. The imaging system also includes a position indication device having a user interface adapted to receive input from a user indicating which of the plurality of markings corresponds to a desired scan plane of the subject.

In another embodiment, a method for landmarking in an imaging system includes detecting a visual or audio cue from an operator with a detection device, wherein the visual or audio cue is indicative of a desired scan plane corresponding to a region of interest of a subject. The method also includes determining, based on the detected visual or audio cue, a location of the region of interest of the subject with respect to a location of a gantry of the imaging system.

In another embodiment, an imaging system includes an imager adapted to obtain an image of a desired region of interest of a subject and a coil positioned on the desired region of interest of the subject. The system also includes a position indication device having contrast medium detectable with a one dimensional scan sequence and being placed on the subject or the coil in a location corresponding to a desired scan plane. Control circuitry is provided to initiate the one dimensional scan sequence to identify the location of the position indication device relative to a gantry of the imaging system.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As described in more detail below, provided herein are systems and methods for landmarking for non-invasive imaging of a subject. More particularly, a variety of techniques are provided below that enable an operator to define a scan plane or a starting point for a search for the scan plane for an imaging operation. For example, some embodiments of the provided techniques enable determination of a location of a radio frequency (RF) receive coil relative to a gantry, thus enabling centering of the receive coil in the field of view of the scanner. For further example, in other embodiments, the provided methods enable determination of a position of a landmark relative to the coil, the gantry, or the patient positioning table. As compared to traditional systems, certain embodiments of these techniques may reduce the amount of time necessary to set up a patient in an imaging system, thus increasing the efficiency of the imaging operation without adding to the complexity of the necessary hardware.

Although certain embodiments of the present techniques are described in the context of an automated magnetic resonance imaging (MRI) system, use of the presently disclosed embodiments in various other imaging applications and systems is also contemplated. Some of these systems, for example, may include non-automated MRI systems, computed tomography (CT) imaging systems, positron emission tomography (PET) imaging systems, optical imaging systems, and hybrid systems combining magnetic resonance (MR) with other modalities. Indeed, the environment that is shown in FIG. 1 illustrates one possible environment suitable for practicing various implementations of the present technique and is not meant to limit contemplated embodiments.

Figure 1:
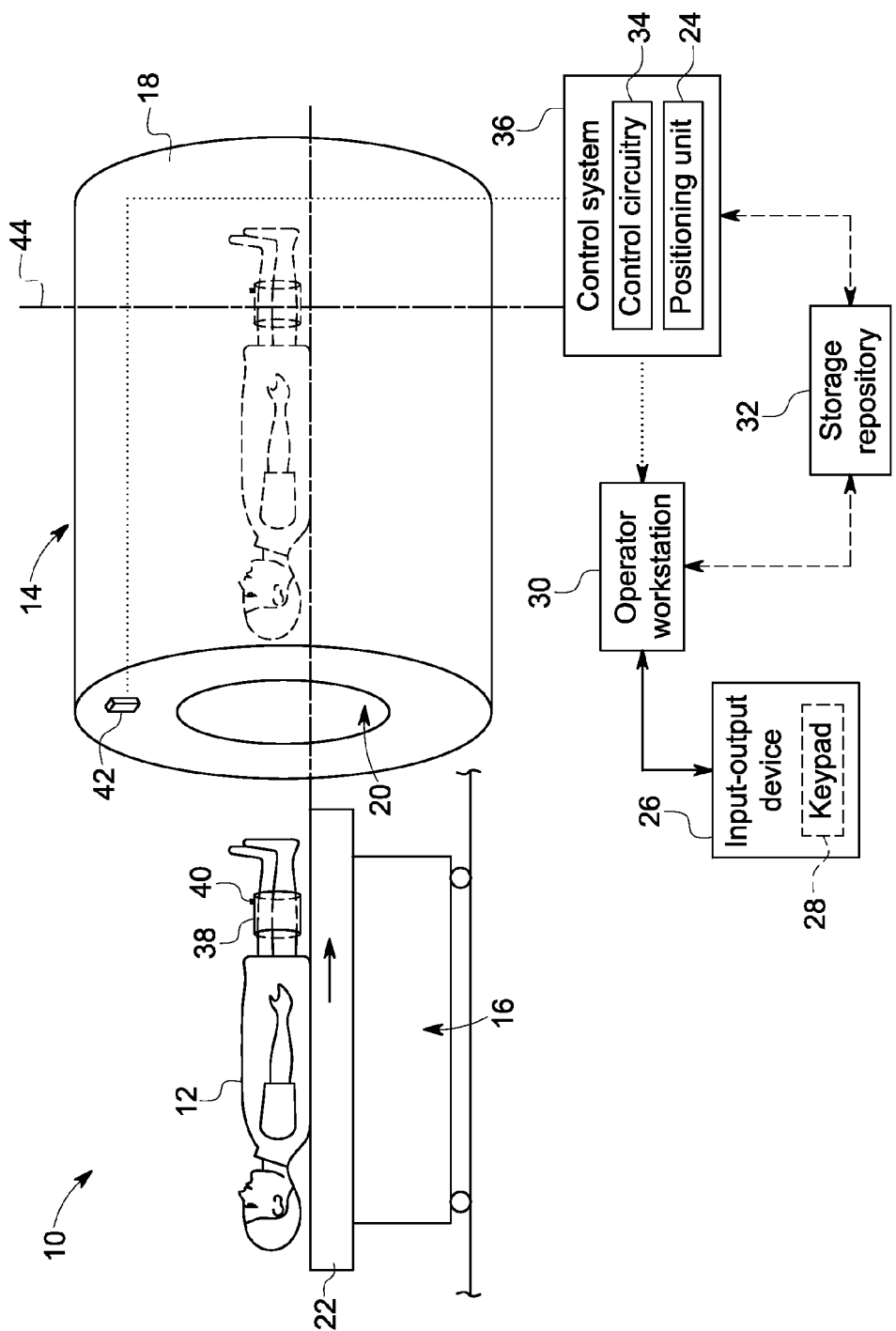
FIG. 1 is a schematic illustrating an embodiment of a landmarking system in accordance with aspects of the present disclosure.

Turning now to the drawings, FIG. 1 illustrates an embodiment of an imaging system 10 for use in landmarking of a subject, such as a patient 12. For discussion purposes, the system 10 is described with reference to patient preparation in an MR imaging operation, but the provided embodiments are not limited to this application. In the illustrated embodiment, the system 10 includes a magnetostatic field generator 14 operatively coupled to a motorized table unit 16. The magnetostatic field generator 14 includes a magnet 18, for example, including RF or gradient coils and a bore 20 to accommodate the patient 12, in one implementation, disposed in a supine position. In other embodiments, however, the patient 12 may be disposed in other positions suitable for imaging.

To that end, the table unit 16 includes a cradle 22 that supports and translates the patient 12 into the magnet bore 20 during operation of the imaging system 10. Particularly, in certain embodiments, the table unit 16 includes a positioning unit 24 that governs motion of the cradle 22, and thus, the patient position within the magnet 18. The positioning unit 24, for example, governs the patient position based on operator inputs, specific exam requirements and/or designated scanning protocols. Accordingly, in certain embodiments, the positioning unit 24 includes devices such as one or more digital signal processors, microcomputers, microcontrollers, Application Specific Integrated Circuits (ASICs), Field Programmable Gate Arrays (FPGA), or one or more general-purpose or application-specific processors in communication with the system 10.

In one embodiment, the positioning unit 24 controls the patient position based on operator inputs received through an input-output device 26 having, for example, a keypad 28, and being coupled to an operator workstation 30. The input-output device 26, for example, includes a display having a graphical user interface (GUI) or a switching subsystem for allowing the operator to select the desired scanning parameters and the desired region of interest (ROI), such as the patient's spine, via the GUI. Alternatively, in certain embodiments, the positioning unit 24 controls the patient position based on scanning parameters specified in a configuration file received from a storage repository 32. To that end, the storage repository 32, for example, includes a random access memory, a read only memory, a disc drive, solid-state memory device, and/or a flash memory communicatively coupled to the system 10.

In the illustrated embodiment, the positioning unit 24, on receiving the scanning parameters, advances the cradle 22 into the bore 20, for example, by coordinating control with control circuitry 34 in the control system 36, and performs the landmark operation. To that end, in certain implementations, an RF coil 38 is positioned on the desired ROI of the patient 12 under evaluation. In the illustrated embodiment, for example, the RF coil 38 is positioned on a knee of the patient 12 before the patient 12 is translated into the magnet bore 20. The illustrated patient 12 is then moved into the magnet bore 20 in a feet-first orientation. The patient 12, however, can be positioned in either the headfirst or the feet-first orientation depending upon the desired ROI of the patient 12 under evaluation. Brain exams, for example, may be performed with the patient 12 in the headfirst orientation, while lower chest and abdominal studies may be performed with the patient 12 in the feet-first orientation.

In a typical MR system, once the patient is positioned on the table, one or more laser alignment lights are turned on, and the operator moves the table into a magnet bore until the desired ROI is positioned under the laser alignment lights. The operator pushes a landmark button to register the patient with a coordinate system of the MR system and advances the patient to a scan position, which positions the region that was just landmarked in the center of the magnet, characterized by best field homogeneity. The operator then initiates patient scan by pushing a "start scan" button on an operator console. Typical MR imaging, thus, entails lengthy and multi-step landmarking operations that rely significantly on operator intervention, experience, and expertise.

However, embodiments of the techniques provided herein may address one or more of these drawbacks, for example, by reducing the level of operator participation in the landmarking process without requiring the addition of costly hardware. Accordingly, depending on implementation-specific considerations, the system 10 may include one or more additional components utilized in the landmarking operation. For example, in the illustrated embodiment, a marker 40 is embedded or positioned on the RF coil 38, or placed directly on the region of interest of the patient 12 or the cradle 22, to enable landmarking of the desired ROI. The marker 40, for example, may be positioned at the S/I center, the S/I extents or any other suitable position on the RF coil 38. In another embodiment, the marker 40 represents multiple markers positioned along the length of the RF coil 38 to enable an operator to identify the markers corresponding to the desired scan plane. For example, in one such embodiment, the markers 40 may be numbers, and the operator may choose the numbers corresponding to the desired scan plane and input those numbers, for instance, into the keypad 28, to communicate the desired scan plane to the control circuitry 34.

For further example, another additional optional component depicted in the embodiment of FIG. 1 is a camera 42 mounted above the bore 20 for detection of visual and/or audio cues related to the desired scan plane. The camera 42 is communicatively coupled to the control system 36 for processing and/or storage of the detected cues, and the cues are utilized for landmarking. For instance, in one embodiment, the operator may indicate the desired scan plane by expressing an audio cue (e.g., "scan here") while performing a visually detectable gesture (e.g., performing an arm motion across the patient in a position corresponding to the desired scan plane). In this embodiment, the camera 42 detects these visual and audio cues and communicates them to the control system 36. The control circuitry 34 processes the acquired information to determine the scan plane desired by the operator and, based on the desired scan plane, the appropriate patient positioning within the bore 20.

In one embodiment camera 42 has 3D capability, allowing the camera 42 to determine the location of the hand gesture of the operator without parallax error. Such capability can be provided in various ways, such as with the use of off-axis structured illumination or by using more than one camera or point of view. In yet another embodiment, the operator may be provided with a handheld device, such as a small wand, that contains a sensor capable of detecting a magnetic field, such as a magnetoresistance sensor. Because the static magnetic field of the MR system drops off rapidly with distance from the bore, the "landmarking gesture" that the operator makes with the handheld device (e.g., wand) can be combined with information from the handheld device about the strength of the magnetic field, and translated into an absolute distance from the isocenter of the MRI bore. The handheld device could also include inertial sensors to allow for a wider range of gestures to be detected and interpreted (for example, a quick swish and flick of the handheld device towards the bore of the magnet might indicate "move the patient into the bore").

The control circuitry 34 then coordinates with the positioning unit 24 to position the patient within the magnet 18 for imaging. For example, the positioning unit 24 may coordinate movement of the cradle 22 such that the RF coil 38 is aligned with the iso-center 44 of the magnet 18. To that end, in certain embodiments, the system 10 may include components, such as position encoders and/or sensors, located on the table unit 16 and/or the magnet 18 for determining the longitudinal position of the cradle 22 with respect to the magnet 18. The positioning unit 24 coordinates with the control circuitry 34 and any position detecting devices present in the given implementation to advance the cradle 22 to the iso-center 44 (or another desired alignment point within the magnet 18) and sets a landmark to enable an advance to scan position of the desired ROI for generating diagnostic images for use in patient evaluation and treatment.

It should be noted that while the embodiment illustrated in FIG. 1 includes an external coil (i.e., coil 38) positioned over the anatomy of interest, in other embodiments, the scanner body coil located within the bore of the magnet may instead be utilized for landmarking purposes when the patient is located inside the scanner body coil. Indeed, as described in more detail below, certain methods provided herein may be implemented utilizing the scanner body coil instead of an external coil for landmarking.

Figure 2:
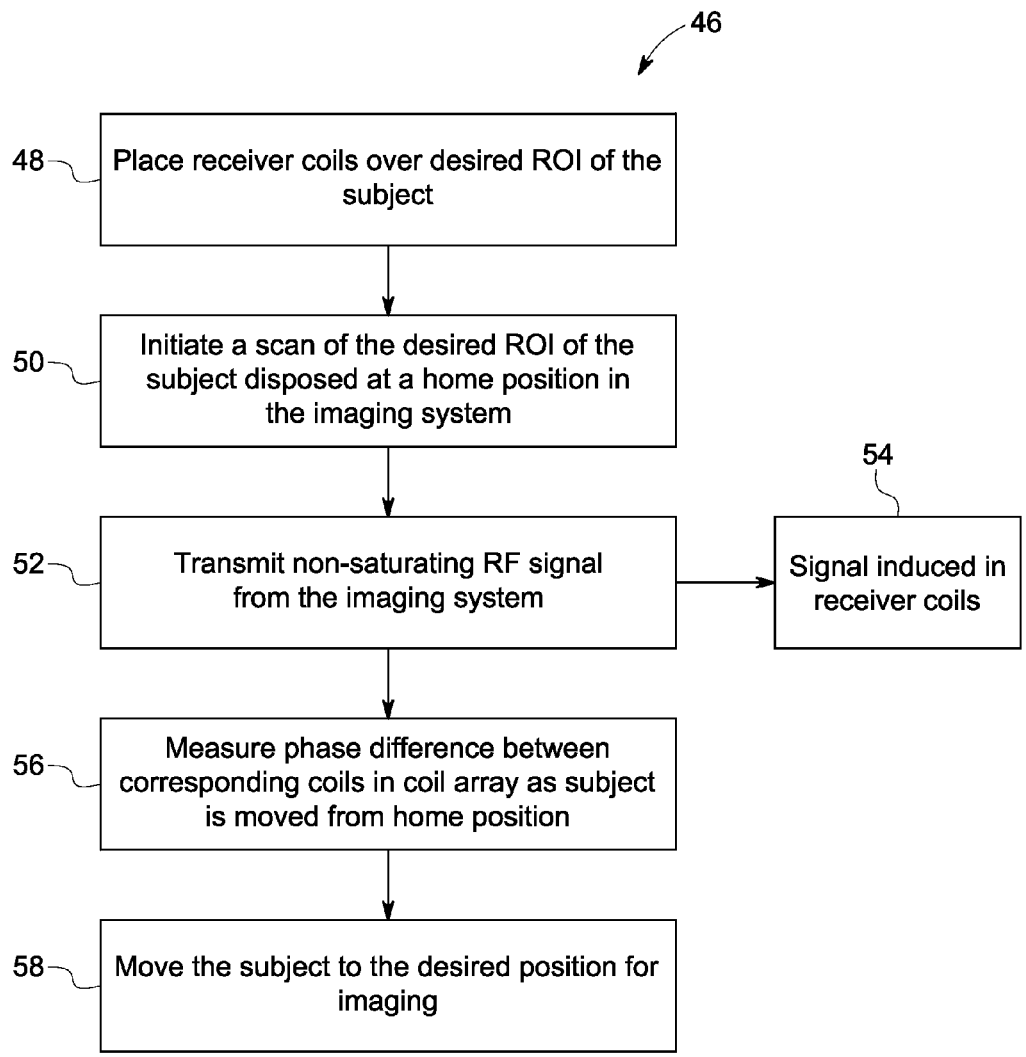
FIG. 2 is a flowchart illustrating an embodiment of a method for determining a location of a coil relative to a gantry in an imaging system.

FIG. 2 illustrates an embodiment of a method 46 that may be utilized to perform landmarking in the imaging system 10 shown in FIG. 1. This method 46 achieves landmarking by determining the location of the RF coil (e.g., coil 38) relative to the imaging gantry. Accordingly, the method 46 begins with placement of the RF coil or coil array over a desired ROI of the subject (block 48). For example, in the depiction in FIG. 1, the RF coil 38 is placed over the patient's knee. The operator then initiates a scan of the desired ROI of the subject while the subject is located at a home position within the imaging system (block 50). For example, the home position may be the position illustrated in FIG. 1 in which the patient 12 and the table unit 16 are positioned outside of the bore 20 of the magnet 18. The operator may initiate the scan procedure, for example, by indicating on a user interface associated with the input-output device 26 that a scan is going to occur. This initiation activates the system 10 to be in a standby mode and ready for the imaging operation.

Once the operator initiates the operation, the control system 36 generates signals to guide the system to perform landmarking. More particularly, in the illustrated embodiment, the control circuitry 34 transmits a non-saturating RF signal from the imaging system (block 52). That is, a weak signal is transmitted from the MR system that is sufficiently weak so as not the saturate the pre-amps of the receive coils even when the coils are not blocked. Accordingly, a signal is induced in the receiver coils (block 54).

The method 46 proceeds with measurement of the phase difference between corresponding coils at either end of the receiver coil array as the patient is moved from the home position (block 56). By monitoring this phase difference during movement of the patient, the subject may be moved to the desired position for imaging (block 58). For example, it is now recognized that the phase difference between corresponding coils at either end of the receiver coil array will go to zero when the receiver coil array is centered relative to the excitation coils. If this centering position is the desired position, the positioning unit 24 may move the table unit 16 until the measured phase difference is zero. If the centered position is not the desired position, the control circuitry 34 may utilize this property to determine a reference point for the coil location so that the desired position may be achieved. However, in either instance, multiple scans of this type may be taken as the table unit 16 is moved into position and by comparing the amplitudes of the received signals, the control circuitry 34 may determine the needed translation distance.

It should be noted that in some embodiments, it may not be possible to transmit a sufficiently low intensity signal to probe the receiver coils. In these implementations, detection of a coil response from detuned (i.e., blocked) coils may be utilized. In these embodiments, the method 46 also includes a calibration step for the purpose of determining the phase relationship of the received signal and the coil position.

Figure 3:
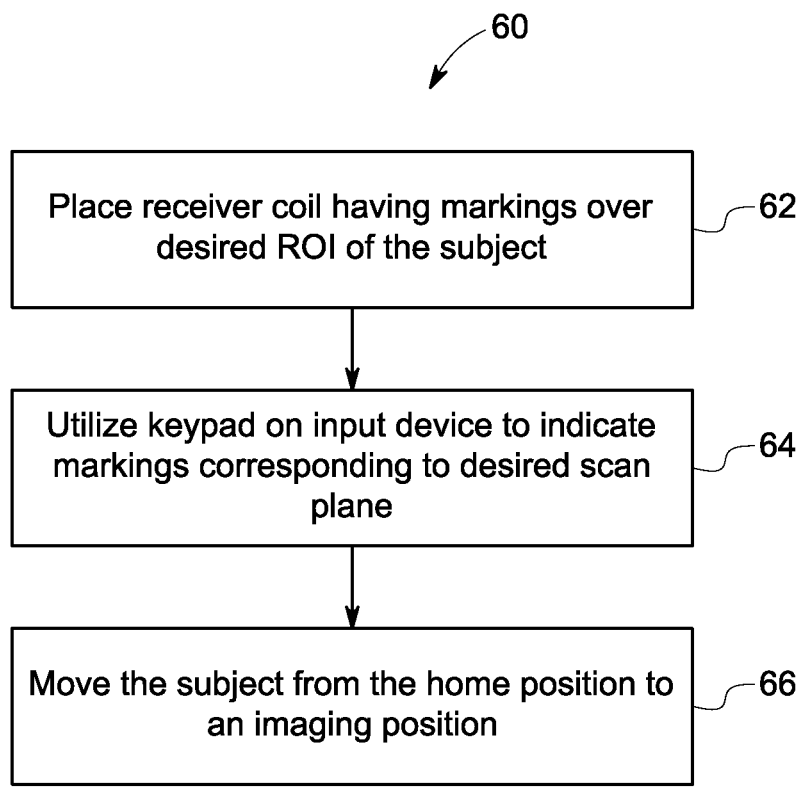
FIG. 3 is a flowchart illustrating an embodiment of a method for receiving operator input corresponding to a desired scan plane for an imaging operation.

FIG. 3 illustrates an embodiment of another method 60 for performing landmarking in the imaging system 10. This method 60 includes placing a receiver coil having one or more markings over the desired ROI of the patient (block 62) and utilizing a keypad to indicate which of the markings correspond to the desired scan plane (block 64). The patient is then moved from the home position outside the magnet bore to the desired position within the bore (block 66).

In one embodiment, a plurality of markers 40 are placed on the RF coil 38 at a plurality of positions on the coil. The markers 40 may include but are not limited to numerical markings, alphanumerical markings, pictorial markings, patterned markings, or a combination thereof For example, in one embodiment, the markers 40 are numerical markers, and the operator selects which numerical markers most closely correspond to the desired scan plane. Once selected, the operator communicates those markers to the control system 36, for example, via keypad 28 on the input-output device 26. Further, it should be noted that the markers may be located on the coil 38, on the table 16, or in another suitable position in imaging system 10. If the markers are located on the coil 38, the control system 36 may separately determine the location of the coil 38, for example, by implementing method 46 described above. In some embodiments, if the markers are located on the table, the external coil placed over the region of interest may not be necessary, and the scanner body coil may instead be used for landmarking.

Figure 4:
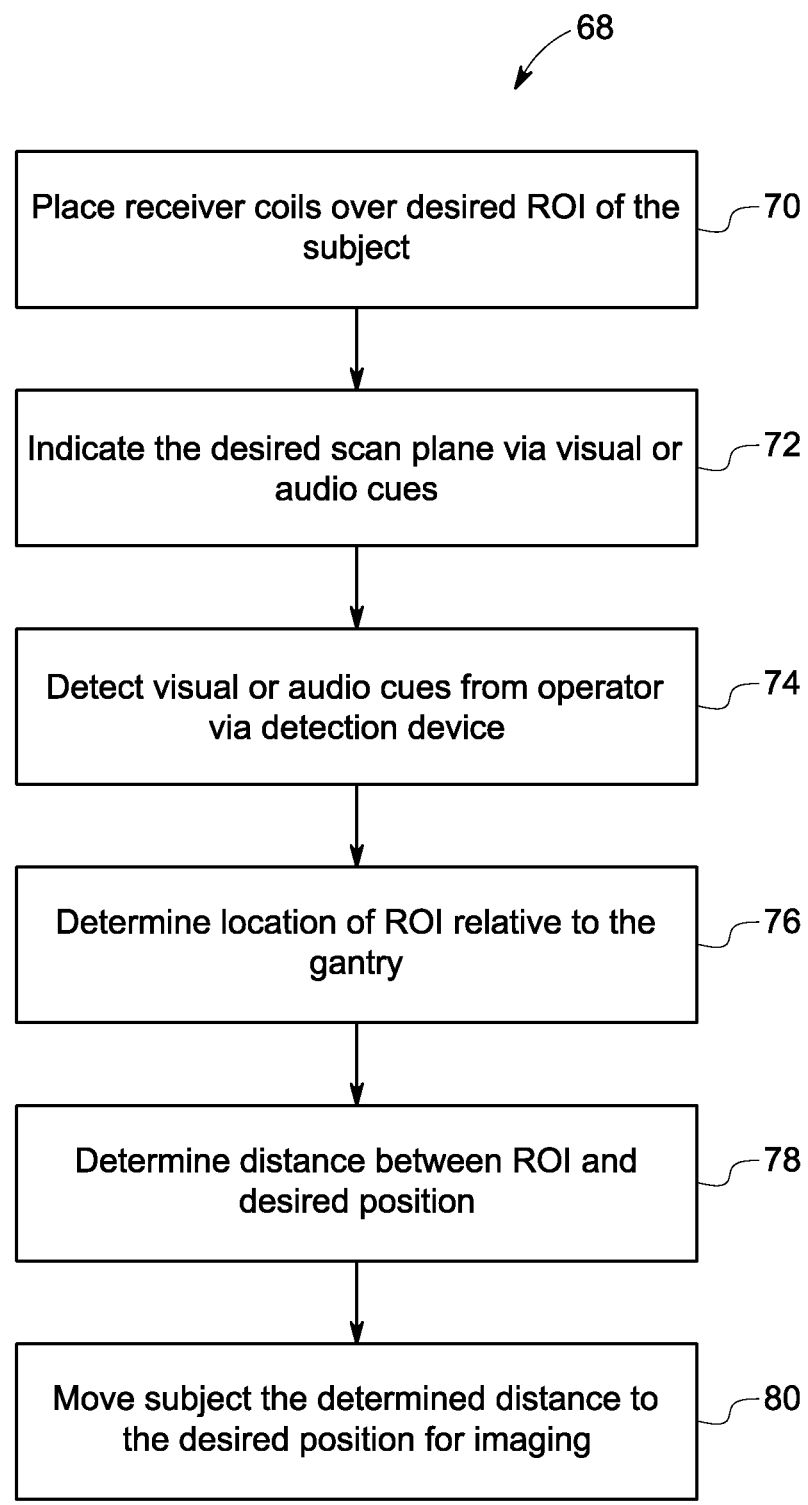
FIG. 4 is a flowchart illustrating an embodiment of a method for gesture-based communication of a desired scan plane in an imaging operation.

FIG. 4 illustrates an embodiment of another method 68 for performing landmarking in the imaging system 10. It should be noted that method 68 may be implemented with either the external coil or the scanner body coil used for landmarking. During implementation of this method 68, receiver coils are placed over the desired ROI of the subject (block 70), and the operator indicates the desired scan plane via visual or audio cues (block 72). For example, the operator may indicate the desired scan plane by expressing an audio cue (e.g., "scan here") while performing a visually detectable gesture (e.g., performing an arm motion across the patient in a position corresponding to the desired scan plane). In certain embodiments, the operator may wear a coded accessory (e.g., a colored glove) or use a handheld device (such as a device incorporating one or both of magnetic or inertial sensing components, as discussed above) that aids in the communication of the desired scan plane.

The method 68 further calls for the detection of the visual and/or audio cues from the operator via a detection device, such as a camera (block 74). Once the cues are detected, the control circuitry 34 determines the location of the ROI of the patient relative to the gantry (block 76) and the distance between the ROI of the patient and the desired position of the patient (block 78). The control circuitry 34 then communicates with the positioning unit 24 to move the patient the determined distance to the desired position for imaging (block 80).

Figure 5:
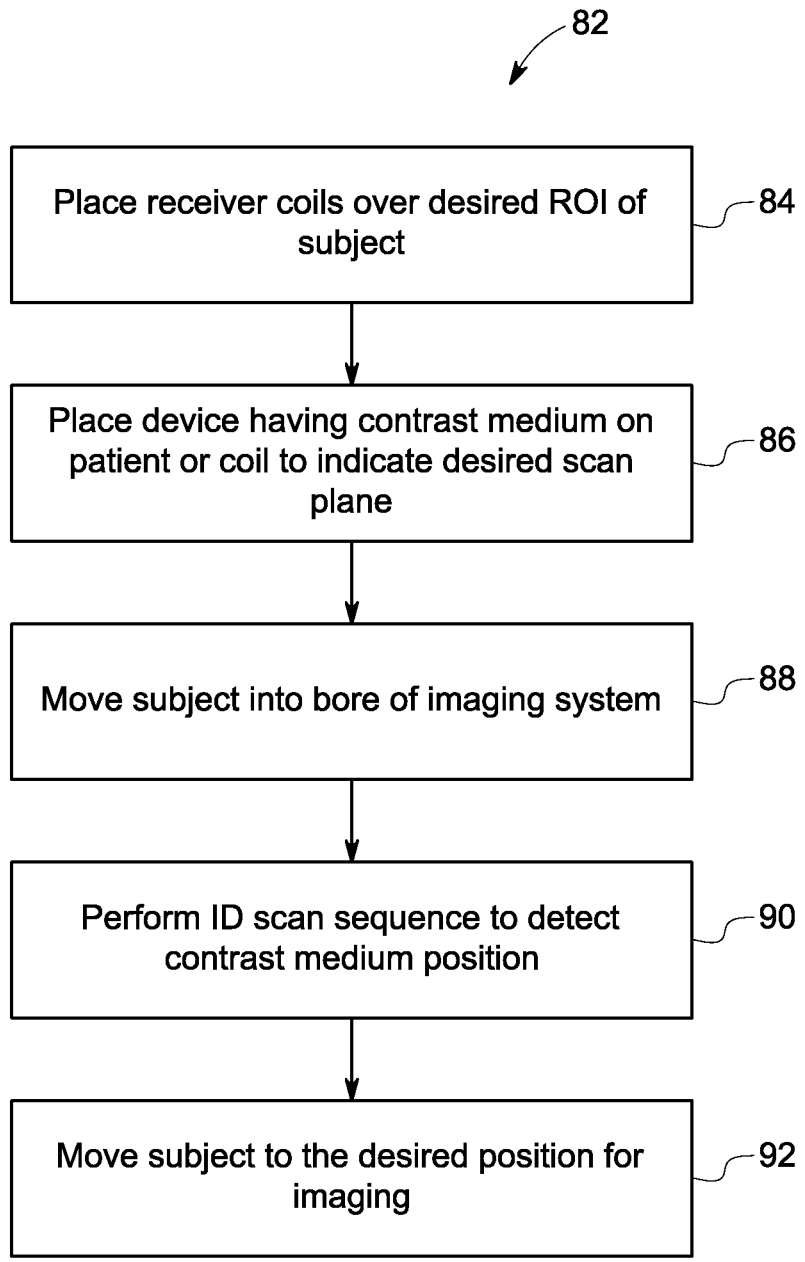
FIG. 5 is a flowchart illustrating an embodiment of a method for utilizing a position indication device having contrast medium to determine a desired scan plane in an imaging operation.

FIG. 5 illustrates an embodiment of another method 82 for performing landmarking in the imaging system 10. It should be noted that method 68 may be implemented with either the external coil or the scanner body coil used for landmarking. During implementation of this method 82, receiver coils are placed over the desired ROI of the subject (block 84), and a device having contrast medium is placed on the patient or the coil to indicate the desired scan plane (block 86). The subject is then moved into the bore of the magnet (block 88) and a one dimensional scan sequence is performed to detect the position of the contrast medium (block 90). As before, the patient may then be moved to the desired position for imaging (block 92).

That is, in this embodiment, the device placed on the patient includes MRI contrast medium that can be detected as the patient is moved into the bore and used by the control circuitry 34 to determine the correct location of the scan plane. It should be noted that the contrast medium may be non-proton medium in some embodiments to reduce or eliminate the possibility of interference occurring during imaging. In such embodiments, additional circuitry, such as wide-band electronics may be included for detection purposes.

The contrast medium containing device may be adhesive in some embodiments to facilitate initial placement and maintenance of that placement during imaging. In other embodiments, a variety of suitable attachment mechanisms, such as clips or snaps, may be employed to couple the device to the patient or the coil in the desired location. Further, the device may be disposable and configured for one time use or reusable and configured for multiple uses, for example, with a plurality of different patients.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for landmarking in an imaging system, comprising:
   inducing a non-saturating signal in a receive coil array, wherein the receive coil array is placed over a desired region of interest of a subject;
   using a processor, determining a phase difference between one or more sets of corresponding coils in the receive coil array;
   using the processor, determining, based on the determined phase difference between the one or more sets of corresponding coils in the receive coil array, a location of the receive coil array with respect to a gantry of the imaging system; and
   moving the subject to an imaging position based upon the location determined by the processor.

2. The method of claim 1, comprising using the processor to determine, based on the location of the receive coil array, a distance between the location of the receive coil array and a homogeneous position of a magnet of the imaging system.

3. The method of claim of claim 2, wherein moving the subject comprises moving the subject within the gantry over the determined distance to align the receive coil array with the homogeneous position of the magnet of the imaging system.

4. The method of claim 1, wherein the imaging system comprises a magnetic resonance imaging system.

5. An imaging system, comprising:
   an imager configured to obtain an image of a desired region of interest of a subject;
   a coil configured to be positioned on the desired region of interest of the subject, wherein the coil comprises a plurality of markings disposed at a plurality of locations on the coil; and
   a position indication device comprising a user interface configured to receive input from a user indicating which of the plurality of markings corresponds to a desired scan plane of the subject.

6. The system of claim 5, wherein the user interface comprises a keypad located on a gantry of the imager, wherein the keypad comprising a plurality of markings corresponding to the plurality of markings disposed on the coil.

7. The system of claim 5, wherein the plurality of markings comprise numerical markings, alphabetical markings, pictoral markings, patterned markings, or a combination thereof.

8. The system of claim 5, wherein the imager comprises a magnetic resonance imaging system.

9. An imaging system, comprising:
   an imager configured to obtain an image of a desired region of interest of a subject; and
   control circuitry configured to:
      induce a non-saturating signal in a receive coil array when the receive coil array is placed over a desired region of interest of a subject;
      determine a phase difference between one or more sets of corresponding coils in the receive coil array; and
      determine, based on the determined phase difference between the one or more sets of corresponding coils in the receive coil array, a location of the receive coil array with respect to a gantry of the imaging system.

10. The imaging system of claim 9, wherein the control circuitry is further configured to determine, based on the location of the receive coil array, a distance between the location of the receive coil array and a homogeneous position of a magnet of the imaging system.

11. The imaging system of claim 9, wherein the control circuitry is further configured to move the subject within the gantry over the determined distance to align the receive coil array with the homogeneous position of the magnet of the imaging system.

12. The imaging system of claim 9, wherein the imaging system comprises a magnetic resonance imaging system.

\* \* \* \* \*